(12) United States Patent
Jeon et al.

(10) Patent No.: US 8,106,308 B2
(45) Date of Patent: Jan. 31, 2012

(54) PRINTED CIRCUIT BOARD FOR PACKAGE AND MANUFACTURING METHOD THEREOF

(75) Inventors: Hyung-Jin Jeon, Gunpo-si (KR); Young-Hwan Shin, Daejeon (KR); Tae-Gon Lee, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1065 days.

(21) Appl. No.: 11/898,915

(22) Filed: Sep. 17, 2007

(65) Prior Publication Data
US 2008/0066954 A1  Mar. 20, 2008

(30) Foreign Application Priority Data
Sep. 19, 2006  (KR) .................. 10-2006-0090420

(51) Int. Cl.
*H05K 1/11*  (2006.01)
(52) U.S. Cl. ........................................ 174/261
(58) Field of Classification Search .................. 361/764, 361/783
See application file for complete search history.

(56) References Cited

U.S. PATENT DOCUMENTS

| | | | |
|---|---|---|---|
| 6,256,875 B1 * | 7/2001 | Watanabe et al. | 29/830 |
| 6,395,633 B1 * | 5/2002 | Cheng et al. | 438/687 |
| 7,387,917 B2 * | 6/2008 | Choi et al. | 438/125 |
| 2008/0314632 A1 * | 12/2008 | Wu et al. | 174/263 |

FOREIGN PATENT DOCUMENTS
JP  4-147634  5/1992

OTHER PUBLICATIONS

Japanese Office Action issued Sep. 7, 2010 in corresponding Japanese Patent Application 2007-234493.

* cited by examiner

*Primary Examiner* — Jeremy Norris
*Assistant Examiner* — Tremesha S Willis

(57) ABSTRACT

A printed circuit board for a package includes a first insulation layer, on one side of which an electronic component having a plurality of electrical contacts is mounted; a plurality of first bond pads formed on the other side of the first insulation layer in predetermined intervals, which are electrically connected with the electrical contacts; a second insulation layer stacked on the other side of the first insulation layer, with those portions removed where the first bond pads are formed; and a second bond pad, which is formed on a surface of the second insulation layer in correspondence with positions between the plurality of the first bond pads, and which is electrically connected with the electrical contacts. The bond pads can be implemented in two layers, as opposed to the case of forming the bond pads in one layer, in a predetermined area of a printed circuit board.

11 Claims, 15 Drawing Sheets

PRINTED CIRCUIT BOARD FOR PACKAGE AND MANUFACTURING METHOD THEREOF

CROSS-REFERENCE TO RELATED APPLICATIONS

This application claims the benefit of Korean Patent Application No. 10-2006-0090420 filed with the Korean Intellectual Property Office on Sep. 19, 2006, the disclosure of which is incorporated herein by reference in its entirety.

BACKGROUND

1. Technical Field

The present invention relates to a printed circuit board for a package and a method of manufacturing the printed circuit board.

2. Description of the Related Art

With rapid developments in semiconductor technology related to signal processing, there has recently been remarkable growth in the field of semiconductor components. Accordingly, there are developments actively under way in semiconductor packages, such as the SiP (system in package), CSP (chip-sized package), and FCP (flip chip package), etc., in which electronic components such as semiconductor components, etc., are pre-mounted on a printed circuit board to form a package.

Currently, due to the developments in semiconductor technology, the size of a die is becoming smaller, as well as the size of the package board on which to mount the semiconductor component, etc., whereby the area on which to form bond pads, for electrical connection with electronic components, is also decreasing.

Because of such improvements in performance of semiconductor components, as well as needs for high-frequency implementation, there is a demand that the board for a package be designed with a greater number of I/O contacts. This also adds to the lack of space, on a board with reduced size, for forming bond pads required for electrical connection with electronic components, as described above.

With regards the bond pads formed on a board for a package, the typical case had bond pads formed on just one circuit layer, while there are cases, as illustrated in FIG. 1, in which a package board is formed to be shaped like stairs with the bond pads formed on each step such that the bond pads are implemented in two layers.

In the case of the board for a package that has a cross-section shaped like stairs, such as that illustrated in FIG. 1, the bond pads formed on each step are electrically connected to the electrical contacts of an electronic component by wire bonding, as illustrated in FIG. 2, so that a larger number of bond pads can be formed.

However, even though the bond pads are formed in two layers for the board according to the related art illustrated in FIG. 1 and FIG. 2, the bond pads of the first layer and the bond pads of the second layer are formed as stairs and are not disposed on the same level, so that the distance between a bond pad and an electrical contact on a semiconductor component is made different for each layer. Thus, the distance between a bond pad and an electrical contact, i.e. the length of wire for bonding, is made different according to the location of the bond pad, which may ultimately act as electrical resistance, thereby degrading the electrical characteristics of the overall package.

SUMMARY

An aspect of the invention is to provide a board for a package and a method of manufacturing the board, in which the bond pads are formed in two layers and the bond pads formed on each layer are disposed in a row, so that a greater number of bond pads may be implemented in a small area.

One aspect of the invention provides a printed circuit board for a package that includes a first insulation layer, on one side of which an electronic component having a plurality of electrical contacts is mounted; a plurality of first bond pads formed on the other side of the first insulation layer in predetermined intervals, which are electrically connected with the electrical contacts; a second insulation layer stacked on the other side of the first insulation layer, with those portions removed where the first bond pads are formed; and a second bond pad, which is formed on a surface of the second insulation layer in correspondence with positions between the plurality of the first bond pads, and which is electrically connected with the electrical contacts.

The first bond pads may be disposed in a row, and the second bond pad may be positioned in a space between the first bond pads, such that a row of the first bond pads and a row of the second bond pads may be in correspondence with each other.

A first circuit pattern, which is electrically connected with the first bond pads, may be formed on a surface of the first insulation layer, and a second circuit pattern, which is electrically connected with the second bond pads, may be formed on a surface of the second insulation layer.

A surface of the printed circuit board may be coated with solder resist, excluding those portions on which the first bond pads and the second bond pads are formed, while a gold plating layer may be stacked on a surface of the first bond pads and the second bond pads.

A through-hole may be perforated in the printed circuit board in correspondence with a position of the electrical contacts, and the first bond pads and the second bond pads may be disposed around the through-hole. If an electronic component is mounted on one side of the first insulation layer after perforating a through-hole through the first insulation layer and the second insulation layer, the electrical contacts of the electronic component may be exposed through the through-hole towards the bond pads, and if the first bond pads and the second bond pads are disposed around the through-hole, the bond pads and the electrical contacts may be electrically connected by wire bonding, etc.

Another aspect of the invention provides a method of manufacturing a printed circuit board for a package, which includes forming a plurality of first bond pads on a surface of a core board, stacking an insulation layer on the core board, forming at least one second bond pad on a surface of the insulation layer in correspondence with a position of the first bond pads, and exposing the first bond pads by selectively removing the insulation layer in correspondence with a position where the first bond pads are formed.

Forming the first bond pads may include forming an inner layer circuit on a surface of the core board that is electrically connected with the first bond pads, while forming the second bond pads may include forming an outer layer circuit on a surface of the insulation layer that is electrically connected with the second bond pads.

Forming the second bond pads may include perforating a via hole that penetrates the core board and the insulation layer and forming a plating layer in the via hole to electrically connect with the outer layer circuit. Selectively removing the insulation layer may be performed by laser drilling.

The method may further include, after exposing the first bond pads, coating a surface of the printed circuit board with solder resist except for portions on which the first bond pads and the second bond pads are formed, and/or gold plating a surface of the first bond pads and the second bond pads.

After the gold plating, an operation of perforating a through-hole in the printed circuit board adjacent to the first bond pads and the second bond pads may further be included.

Additional aspects and advantages of the invention will be set forth in part in the description which follows, and in part will be obvious from the description, or may be learned by practice of the invention.

BRIEF DESCRIPTION OF THE DRAWINGS

FIGS. 7A to 7I represent a flow diagram illustrating processes for manufacturing a printed circuit board for a package according to an embodiment of the invention.

DETAILED DESCRIPTION

Figure 1:
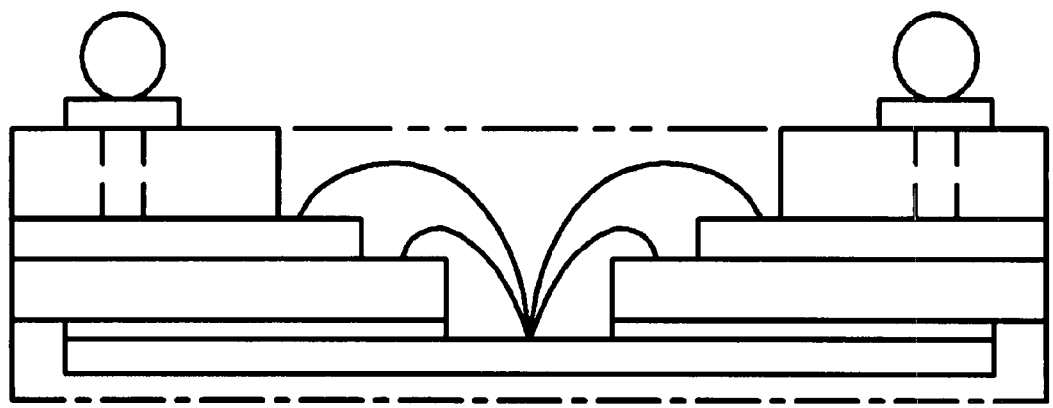
FIG. 1 is a cross-sectional view illustrating a package board according to prior art.
Figure 2:
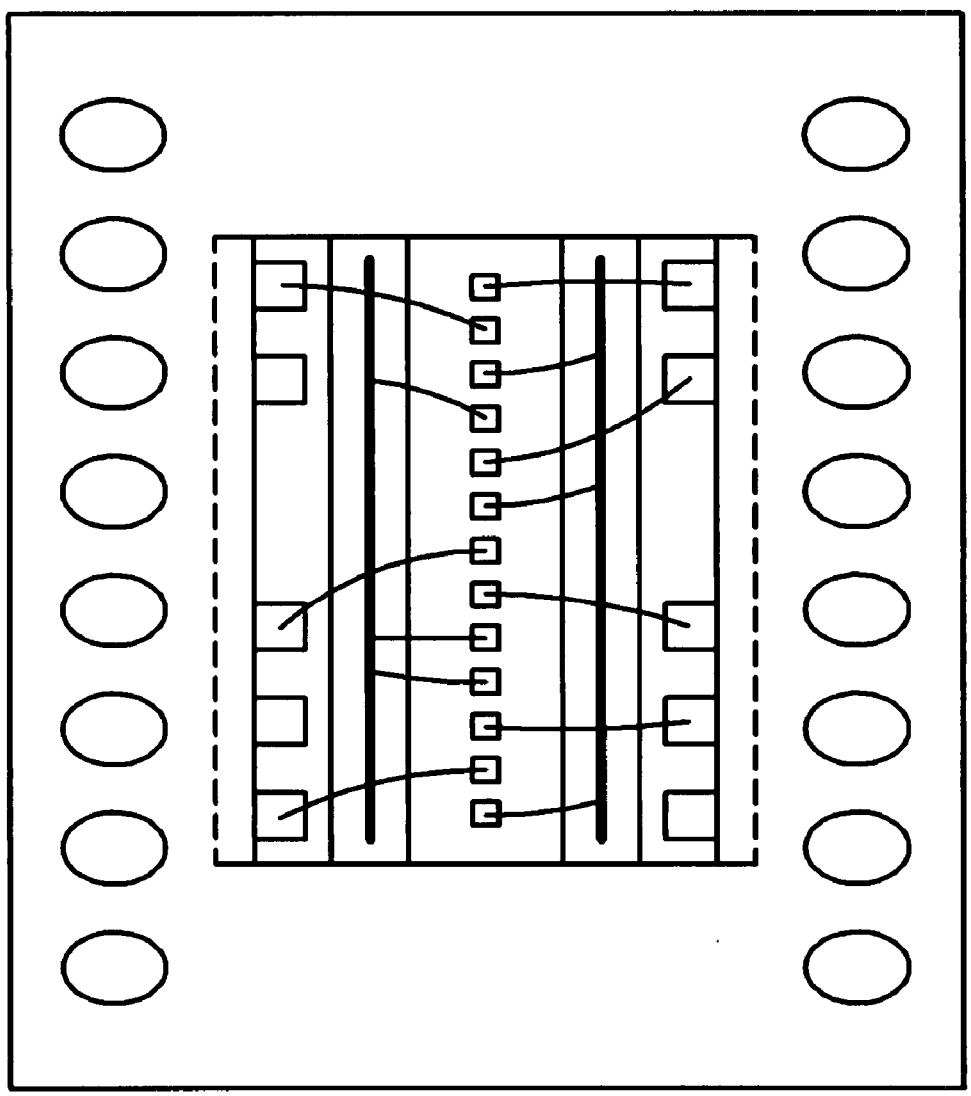
FIG. 2 is a plan view illustrating a package board according to prior art.

The printed circuit board for a package and the method of manufacturing the printed circuit board according to certain embodiments of the invention will be described below in more detail with reference to the accompanying drawings, in which those components are rendered the same reference numeral that are the same or are in correspondence, regardless of the figure number, and redundant explanations are omitted.

Figure 3:
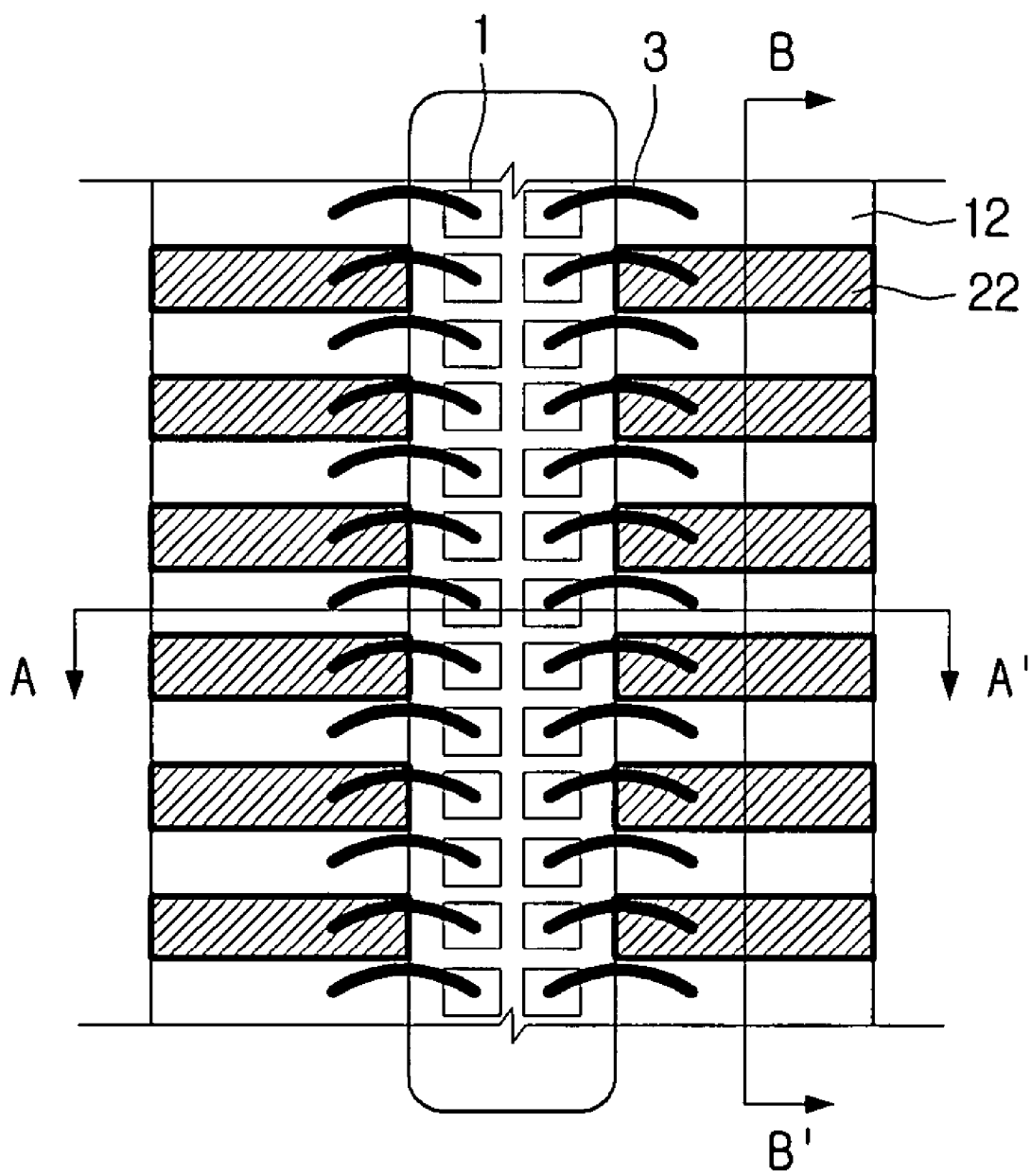
FIG. 3 is a plan view illustrating a printed circuit board for a package according to an embodiment of the invention.
Figure 4:
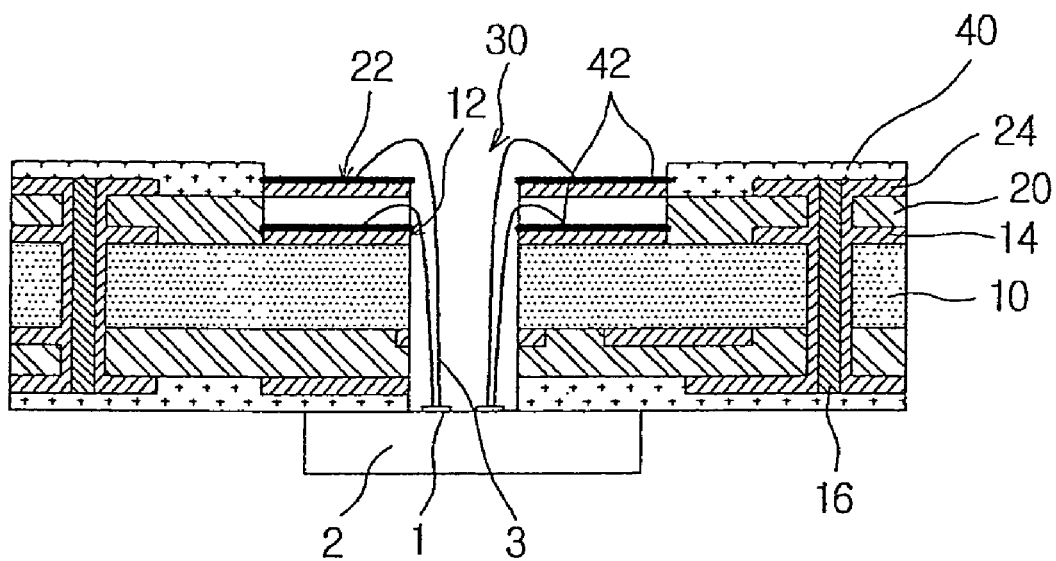
FIG. 4 is a cross-sectional view across line A-A' of FIG. 3.
Figure 5:
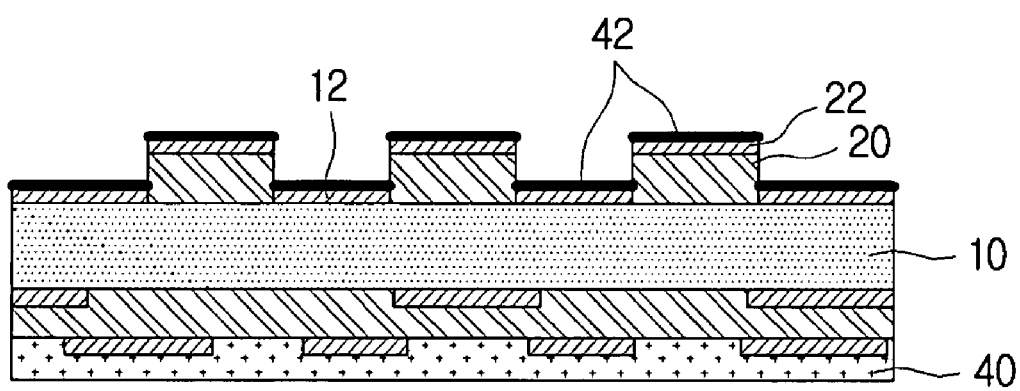
FIG. 5 is a cross-sectional view across line B-B' of FIG. 3.

FIG. 3 is a plan view illustrating a printed circuit board for a package according to an embodiment of the invention, FIG. 4 is a cross-sectional view across line A-A' of FIG. 3, and FIG. 5 is a cross-sectional view across line B-B' of FIG. 3. In FIGS. 3 to 5 are illustrated electrical contacts 1, electronic component 2, bonding wires 3, a core board 10, first bond pads 12, an inner layer circuit 14, a via hole 16, insulation layers 20, second bond pads 22, an outer layer circuit 24, a through-hole 30, solder resist 40, and gold plating layers 42.

In this embodiment, a first layer and second layer of bond pads having different heights may be implemented in a board for a package to be mounted with semiconductor components, etc., and the bond pads of each layer may be disposed in a row as seen from a top planar view, so that a greater number of I/O bond pads may be implemented in a small region.

A package board according to this embodiment may have the structure of a multi-layer printed circuit board having two or more circuit pattern layers. That is, an inner layer circuit 14 may be formed on the core board 10, and after a build-up of an insulation layer 20 thereon, an outer layer circuit 24 may be formed on a surface of the insulation layer 20 to form a printed circuit board having multiple layers.

In the inner layer circuit 14 formed on a surface of the core board 10, first bond pads 12 are included for electrical connection with the electrical contacts 1 of a semiconductor component mounted on the package board. In FIG. 4, it is illustrated how the first bond pads 12 are formed around the through-hole, which is for exposing the electrical contacts 1 of the semiconductor component, and in FIG. 5, it is illustrated how the first bond pads 12 are disposed in lines along the periphery of the through-hole 30. Consequently, as in FIG. 3, the first bond pads 12 are disposed in two rows along the periphery on either side of the through-hole 30.

From the perspective of the core board 10, the semiconductor component is mounted on one side of the core board 10 and the bond pads are formed on the other side of the core board 10, forming a structure in which the bond pads and electrical contacts 1 can be connected by bonding wires 3. The first bond pads 12 are formed on the surface of the core board 10 and are designed to be separated with predetermined intervals, in order to provide the spaces in which the second bond pads 22 may be formed.

The insulation layer 20 may be stacked on the surface of the core board 10 where the first bond pads 12 are formed, and the outer layer circuit 24, i.e. the second circuit pattern layer, may be formed on the surface of the insulation layer 20. As with the case of the inner layer circuit 14, the outer layer circuit 24 includes second bond pads 22 for electrical connection with the electrical contacts 1 of the semiconductor component to be mounted on the package board. In FIG. 4, it is illustrated how the second bond pads 22 are formed around the through-hole, which is for exposing the electrical contacts 1 of the semiconductor component, and in FIG. 5, it is illustrated how second bond pads 22 are disposed in lines along the periphery of the through-hole 30. Consequently, as in FIG. 3, the second bond pads 22 are also disposed in two rows along the periphery on either side of the through-hole 30.

By thus disposing the first bond pads 12 and second bond pads 22 on different layers in two rows along the periphery on either side of the through-hole 30, a greater number of bond pads may be designed for the same area. That is, in FIG. 3, even though the first bond pads 12 and the second bond pads 22 are adjacent to each other, they are formed on differing layers, so that there may not be any space required for electrical insulation between bond pads.

After designing the bond pads thus on two layers, in order to dispose the bond pads in lines to be adjacent to each other, the insulation layer 20 may be selectively removed, in portions stacked on the first bond pads 12 such that the first bond pads 12 are exposed, while forming the second bond pads 22 after stacking the insulation layer 20, or after the second bond pads 22 have been formed. That is, by forming the first bond pads 12 such that they are separated in predetermined intervals and forming the second bond pads 22 in portions corresponding to the spaces between the first bond pads 12, and then removing the regions between the second bond pads 22, i.e. the portions of the insulation layer 20 where the first bond pads 12 are positioned, a board for a package according to this embodiment may be obtained.

As illustrated in FIG. 5, by disposing the first bond pads 12 and second bond pads 22 alternately on a first layer and a second layer in a zigzag form, other bond pads may be formed additionally in the spaces between the bond pads, so that a greater number of bond pads may be designed for the same space. Thus, a high-density package board may be provided, in accordance with the decreasing sizes of semiconductor packages.

Also, as noted in FIG. 3, by disposing the bond pads on differing layers in lines, i.e. by disposing the first bond pads 12 and second bond pads 22 such that they are in a single row when seen from above as in FIG. 3, the lengths of the bonding wires 3 for electrical connection of the first bond pads 12 and second bond pads 22 with the electrical contacts 1 may be made the same, to contribute to improved electrical properties.

After the bond pads are formed in such a composition, solder resist 40 may be coated on the surface of the package board, while a gold plating layer 42 high in conductivity may be stacked on the surfaces of the bond pads to improve the reliability of the electrical connections.

As illustrated in FIG. 4, a through-hole 30 may be perforated in a package board according to this embodiment, so that a semiconductor component may be mounted with the electrical contacts 1 exposed. As illustrated in FIG. 3, the bond pads may be disposed around the through-hole 30 for efficient electrical connection between the semiconductor component and the board.

When the semiconductor component is mounted on the core board 10 after thus perforating the through-hole 30 penetrating the package board, the electrical contacts 1 may be exposed by way of the through-hole 30 towards the bond pads, and electrical connections may be implemented by connecting the first bond pads 12 and second bond pads 22 disposed around the through-hole 30 to the electrical contacts 1 with bonding wires 3.

Figure 6:
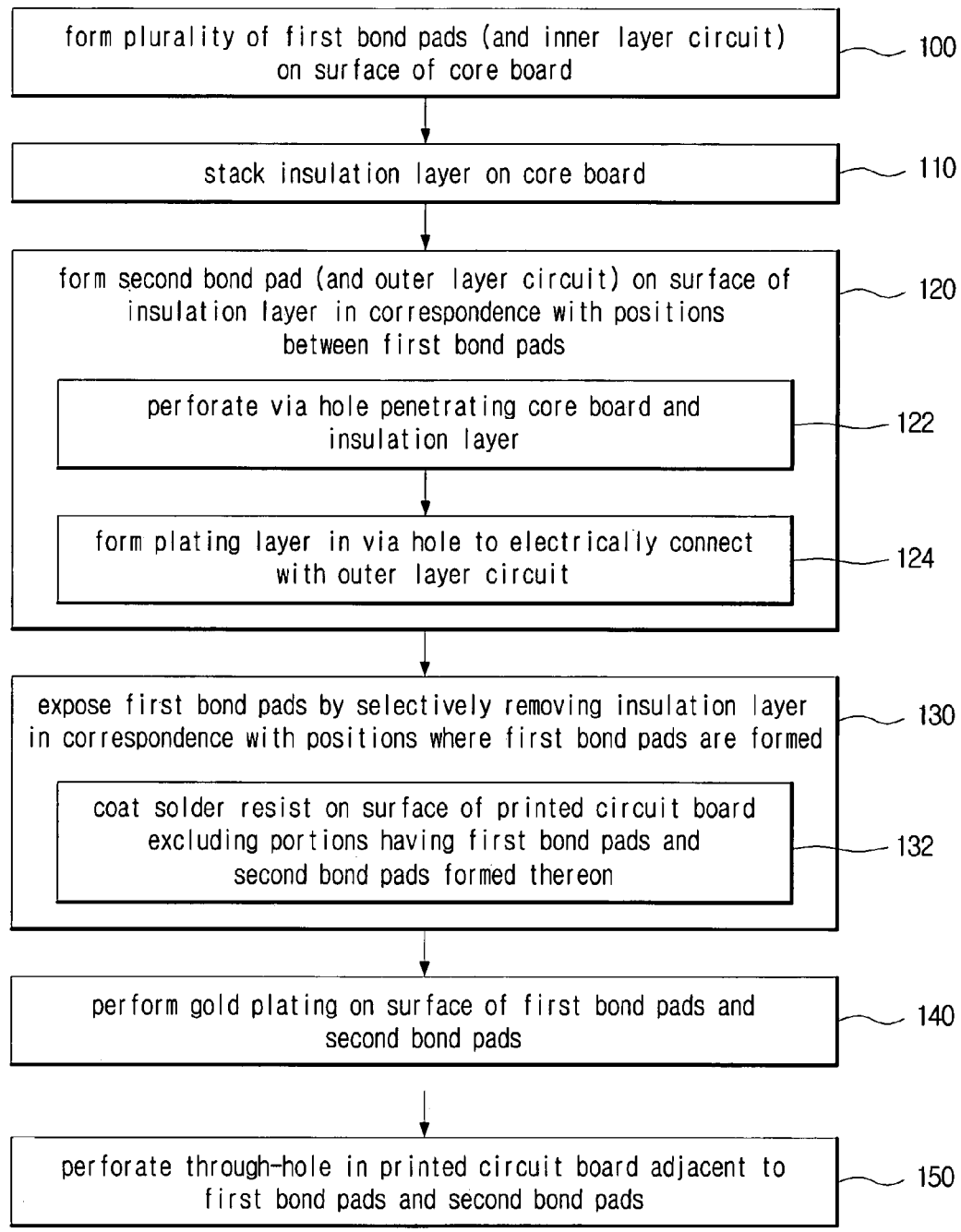
FIG. 6 is a flowchart illustrating a method of manufacturing a printed circuit board for a package according to an embodiment of the invention.

FIG. 6 is a flowchart illustrating a method of manufacturing a printed circuit board for a package according to an embodiment of the invention, and FIGS. 7A to 7I represent a flow diagram illustrating processes for manufacturing a printed circuit board for a package according to an embodiment of the invention. In FIGS. 7A to 7I are illustrated a core board 10, first bond pads 12, an inner layer circuit 14, a via hole 16, insulation layers 20, second bond pads 22, an outer layer circuit 24, a through-hole 30, solder resist 40, and gold plating layers 42.

In manufacturing a board for a package according to the embodiment described above, a major process is the selectively removing of portions of the insulation layer 20 where the first bond pads 12 are positioned, after building up an insulation layer 20 on the core board 10 and forming an outer layer circuit 24. The process of selectively removing and opening the insulation layer 20 in parts around the first bond pads 12 may be performed by plasma or drilling processes, such as by using $CO_2$ laser, etc.

Figure 7A:
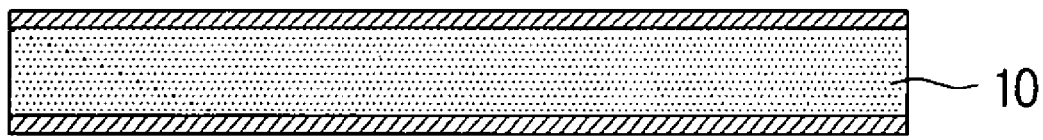
Figure 7B:
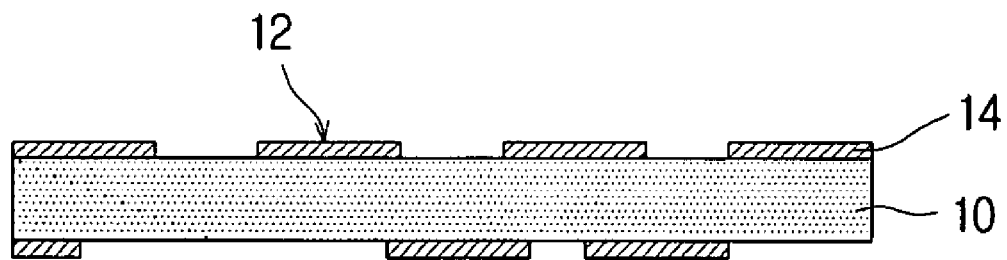
Figure 7C:
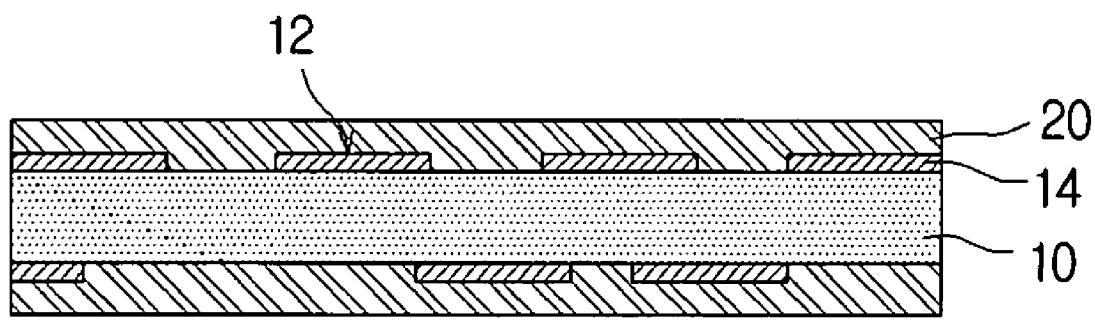
Figure 7D:
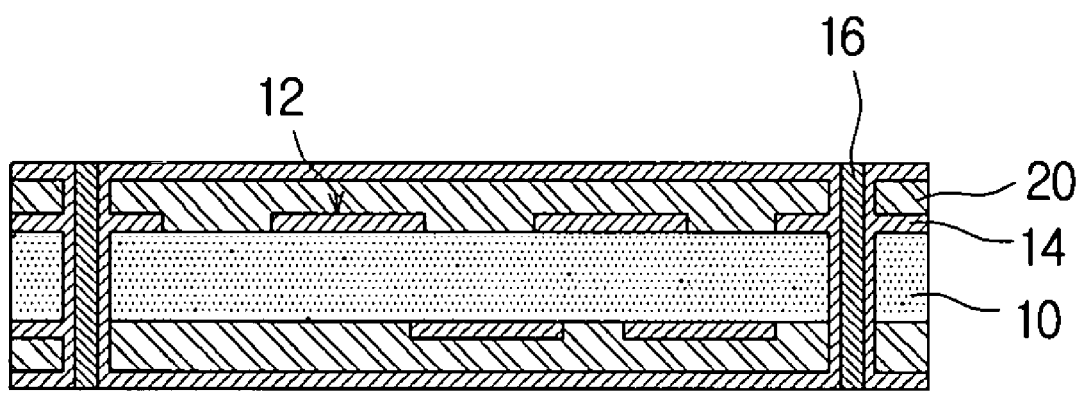
Figure 7E:
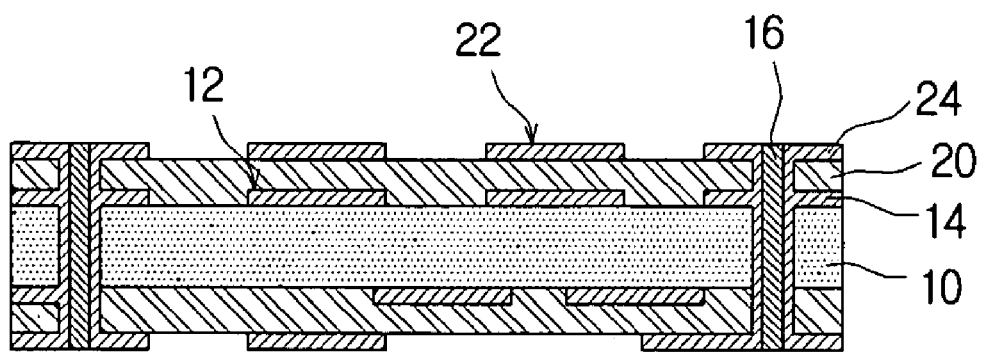

First, on the surface of the core board 10 as in FIG. 7A, the first bond pads 12 and inner layer circuit 14 may be formed (100) as in FIG. 7B, the insulation layer 20 may be built up on the surface of the core board 10 (110) as in FIG. 7C, and the second bond pads 22 and outer layer circuit 24 may be formed on the surface of the insulation layer 20 (120) as in FIG. 7E. As described above, the second bond pads 22 are positioned to be in-between the first bond pads 12.

A general method of manufacturing a multi-layer printed circuit board may be used up to the process of forming the outer layer circuit 24. Therefore, as in FIG. 7D, for electrical connection between circuit layers, those processes may be employed of perforating a via hole 16 that penetrates the core board 10 and insulation layer 20 (122), and plating the via hole 16 to electrically connect the outer layer circuit 24 and the inner layer circuit 14, and/or the outer layer circuit 24 and the outer layer circuit 24 (124). Obviously, various other structures applicable to a multi-layer printed circuit board may be formed as necessary.

Figure 7F:
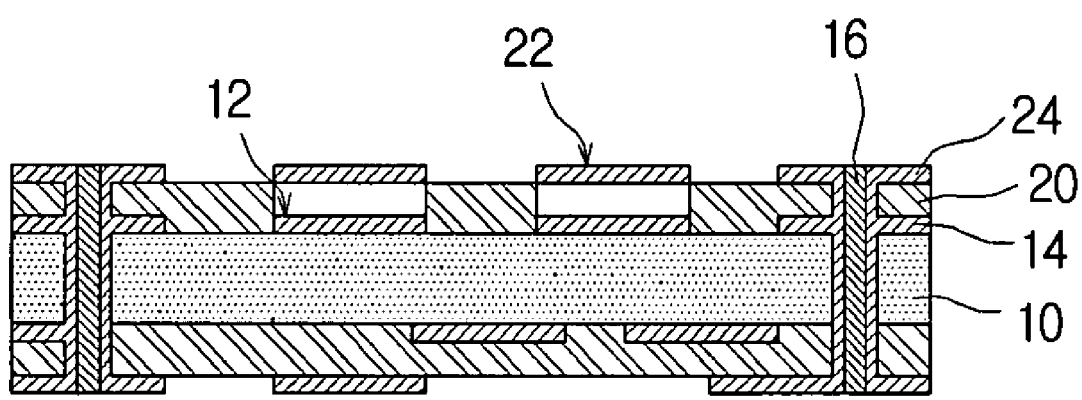

Next, as in FIG. 7F, the insulation layer 20 may be selectively removed in positions where the first bond pads 12 are formed, to expose the first bond pads 12 (130). As described above, various processes such as laser drilling, etc., may be employed for the selective removing of the insulation layer 20, that are applicable to selective removal in a process of manufacturing a printed circuit board.

Figure 7G:
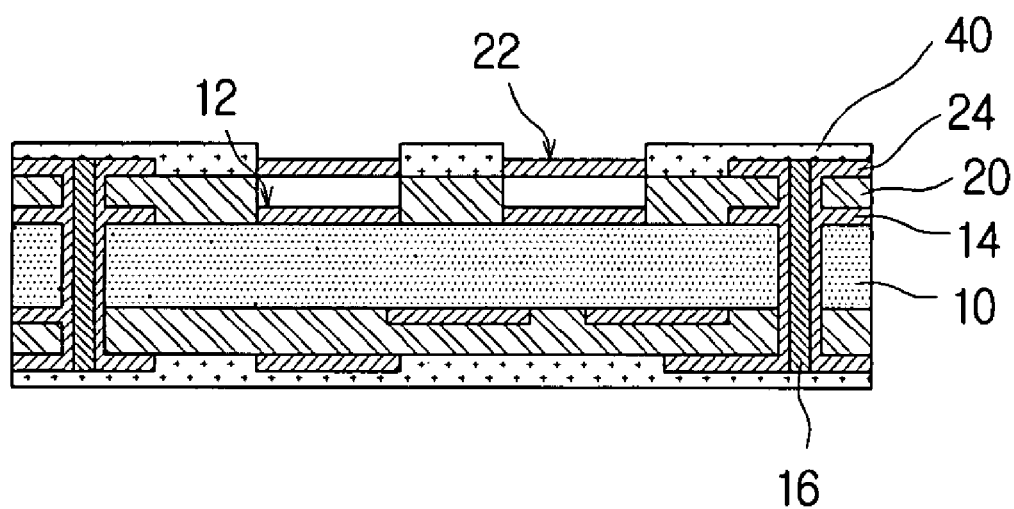
Figure 7H:
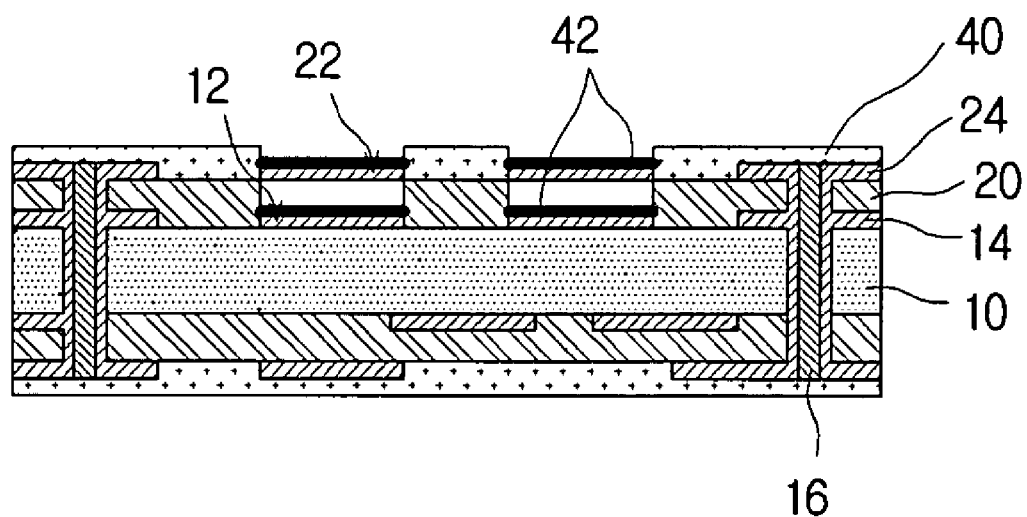
Figure 71:
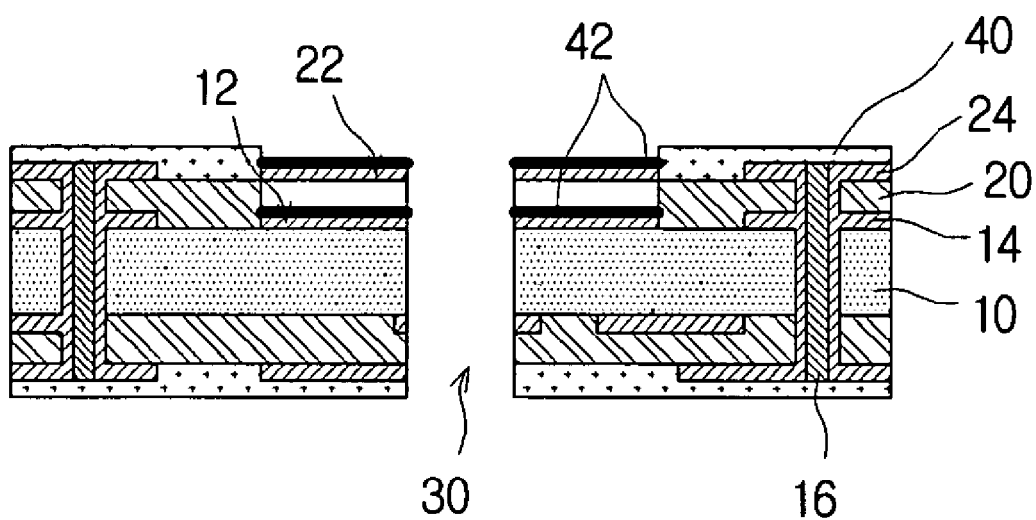

Next, as in FIG. 7G, solder resist 40 may be coated on the surface of the board for a package (132). The solder resist 40 may be for protecting the circuit patterns formed on the surfaces of the board, and may be coated in portions other than the portions of the first bond pads 12 and second bond pads 22 where electrical connection is necessary. As in FIG. 7H, gold plating may be performed on the surfaces of the first bond pads 12 and second bond pads 22 (140), in order to increase the reliability of electrical connection.

Lastly, a through-hole 30 may be perforated (150), as in FIG. 7I, such that the electrical contacts 1 may be exposed when a semiconductor component is mounted. Wire bonding may be performed between the bond pads and electrical contacts 1, when the electrical contacts 1 are exposed through the through-hole 30, so the through-hole 30 may be perforated adjacent to the positions where the first bond pads 12 and second bond pads 22 are disposed, such that the first bond pads 12 and second bond pads 22 are arranged around the through-hole 30.

A semiconductor component may be mounted onto a package board manufactured by the above process, and the electrical contacts 1 and bond pads may be electrically connected by wire bonding, etc., to manufacture a semiconductor package. With a semiconductor package produced according to this embodiment, a greater number of bond pads may be designed for the same area to sufficiently respond to the decreasing sizes of semiconductor components, and since the distance between the bond pads and the electrical contacts 1 remain constant, instead of being changed according to the position of the bond pads, the electrical properties of the semiconductor package may be improved.

According to certain aspects of the invention as set forth above, the bond pad of a second layer may be formed on a different layer in the space between the bond pads of a first layer, i.e. the bond pads may be implemented in two layers, whereby the number of bond pads available for I/O may be increased twofold or more, compared to the case of forming the bond pads in one layer, in a predetermined area of a printed circuit board.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A printed circuit board for a package, the printed circuit board comprising:
   a first insulation layer having an electronic component mounted on one side thereof, the electronic component having a plurality of electrical contacts;
   a plurality of first bond pads formed on an other side of the first insulation layer at predetermined intervals and electrically connected with the electrical contacts;
   a second insulation layer stacked on the other side of the first insulation layer with portions thereof being removed where the first bond pads are formed; and
   a plurality of second bond pads formed on a surface of the second insulation layer and electrically connected with the electrical contacts,
   the first bond pads and the second bond pads being disposed in rows, respectively, and each of the second bond pads being respectively positioned in spaces between the first bond pads, such that the row of the first bond pads and the row of the second bond pads are in correspondence with each other and the first bond pads and the second bond pads are alternatively arranged in a row direction of the first bond pads, and a single through-hole being perforated in the printed circuit board such that all of the electrical contacts are exposed, the first bond pads and the second bond pads being disposed around the through-hole, and the first bond pads and the second bond pads not being connected with each other.

2. The printed circuit board of claim 1, wherein a first circuit pattern is formed on a surface of the first insulation layer and a second circuit pattern is formed on a surface of the second insulation layer, the first circuit pattern is electrically connected with the first bond pads, and the second circuit pattern is electrically connected with the second bond pads.

3. The printed circuit board of claim 1, further comprising a solder resist coated on a surface of the printed circuit board excluding portions having the first bond pads and the second bond pads formed thereon.

4. The printed circuit board of claim 1, further comprising a gold plating layer stacked on a surface of the first bond pads and the second bond pads.

5. A method of manufacturing a printed circuit board for a package, the method comprising:

forming a plurality of first bond pads on a surface of a core board having an electronic component mounted on one side thereof, the electronic component having a plurality of electrical contacts;

stacking an insulation layer on an other surface of the core board;

forming a plurality of second bond pads on a surface of the insulation layer;

exposing the first bond pads by selectively removing a portion of the insulation layer; and perforating a single through-hole in the printed circuit board adjacent to the first bond pads and the second bond pads, the first bond pads and the second bond pads being disposed in rows, respectively, and each of the second bond pads being respectively positioned in spaces between the first bond pads, such that the row of the first bond pads and the row of the second bond pads are in correspondence with each other and the first bond pads and the second bond pads are alternately arranged in a row direction of the first bond pads, the first bond pads and the second bond pads being disposed around the through-hole, and the first bond pads and the second bond pads not being connected with each other.

6. The method of claim 5, wherein the forming of the first bond pads comprises forming an inner layer circuit on the surface of the core board, and the inner layer circuit is electrically connected with the first bond pads.

7. The method of claim 5, wherein the forming of the second bond pads comprises forming an outer layer circuit on the surface of the insulation layer, and the outer layer circuit is electrically connected with the second bond pads.

8. The method of claim 7, wherein the forming of the second bond pads further comprises:

perforating a via hole penetrating the core board and the insulation layer; and forming a plating layer in the via hole to electrically connect with the outer layer circuit.

9. The method of claim 5, wherein the selectively removing the insulation layer is performed by laser drilling.

10. The method of claim 5, further comprising coating a surface of the printed circuit board with a solder resist excluding portions having the first bond pads and the second bond pads formed thereon, after the exposing of the first bond pads.

11. The method of claim 5, further comprising gold plating a surface of the first bond pads and the second bond pads, after the exposing of the first bond pads.

* * * * *